United States Patent [19]

Odlen

[11] 4,340,780
[45] Jul. 20, 1982

[54] SELF-CORRECTING AUDIO EQUALIZER

[75] Inventor: Lars Odlen, Arlov, Sweden

[73] Assignee: Transcale AB, Västerås, Sweden

[21] Appl. No.: 128,245

[22] Filed: Mar. 7, 1980

[51] Int. Cl.³ .............................................. H04R 3/04
[52] U.S. Cl. ................................. 179/1 D; 333/28 R
[58] Field of Search ................... 179/1 D, 1 P, 1 AT,
179/1 VL; 333/28 R, 28 T

[56] References Cited

U.S. PATENT DOCUMENTS

| | | | |
|---|---|---|---|
| 3,293,364 | 12/1966 | Richter | 179/1 D |
| 3,539,725 | 11/1970 | Hellwarth, et al. | 179/1 D |
| 3,949,325 | 4/1976 | Berkovitz | 333/28 R |
| 4,046,960 | 9/1977 | Veale | 179/1 D |
| 4,113,983 | 9/1978 | Steel | 179/1 VL |
| 4,118,601 | 10/1978 | Yeap | 179/1 D |

Primary Examiner—Joseph A. Popek
Attorney, Agent, or Firm—Yount & Tarolli

[57] ABSTRACT

A self-correcting audio equalizer is disclosed for use in a high fidelity sound reproduction system. The equalizer (46) responds to the audio signal to provide an equalized audio signal to a sound reproducing device (28) for generating a corresponding acoustic signal. The equalizer includes circuitry (48–58) for dynamically measuring the differences between the frequency versus amplitude characteristics of the audio and acoustic signals. Another circuit (60–68) automatically adjusts the frequency versus amplitude characteristics of the equalized audio signal so that the measured differences are reduced. The adjustment of the equalizer thus takes place automatically and substantially continuously during normal operation of the system.

17 Claims, 10 Drawing Figures

(a)  (b)

(c)

SELF-CORRECTING AUDIO EQUALIZER

BACKGROUND AND FIELD OF THE INVENTION

The present invention relates to the art of equalization of audio frequency signals, and more particularly ot a self-correcting audio equalizer.

In conventional high fidelity sound reproduction systems, the chief concern of the user is that the sound reaching the listener should conform as precisely as possible to the supplied source signal, whether it be from a turntable, tuner, tape deck, or other source. The impact of current solid state technology in this field has been such that the electronic components, themselves, add very little coloration to the audio signals which are being processed. The same cannot be said, however, for the final steps in the sound reproduction process. Both the high fidelity speakers which actually generate the acoustics signals and the listening environment in which the signals are propagated significantly influence the fidelity of the reproduced sounds, with the latter being the predominant influence of the two.

The difficulty with the listening environment arises from the difference in its responses to different frequency sounds. Some listening environments may be quite lively, providing multiple reflections of high frequency components, whereas others may be quite dead, providing substantial damping of high frequency components. In either case the frequency versus amplitude characteristics of the reproduced sound will be altered. The nature and extent of the alteration will thus vary from listening environment to listening environment, even if the same electronic and speaker components are employed in all cases.

To combat the influence of the listening environment upon the fidelity of reproduction of the audio signal, it has become popular to introduce modifications in the frequency response characteristics of the audio system which compensate for the colorations introduced by the listening environment. This is generally accomplished by means of an audio equalizer which is interposed in the audio signal path between the signal source and the speakers.

Normally, the equalizer comprises a plurality of contiguous narrow band filters covering the entire audio band. The various output signals from the filters are each attenuated by a respectively controlled amount, and are then added back together to form the equalized signal for application to the power amplifier and speakers. The modification in the frequency versus amplitude characteristic introduced by the equalizer will, of course, depend upon the settings of the various attenuators.

Conventionally, these are manually adjusted in the following manner. A signal having a known frequency distribution (such as pink noise, which has a substantially constant energy content per octave) is applied to the equalizer input in place of the normal source signal. The frequency characteristics of the acoustic signal within the listening environment is then determined by means of a special microphone and spectrum analyzer. Any difference between the known frequency characteristics of the applied signal and the measured frequency characteristics of the acoustic signal are removed by adjusting the attenuators for the narrow band filters. After adjustement of the equalizer, the test signal source is disconnected from the system and the normal audio signal source is applied through the equalizer to the loudspeaker system.

Since a special set up procedure is required to adjust the equalizer, the equalizer settings are not normally changed very often, certainly not during the normal operation of the system. Consequently, if any changes occur within the listening environment which change its frequency response characteristics, then the fidelity of reproduction will be adversely affected. This may occur, for example, where the user changes the orientation of the speakers, where furniture is moved about in a room, where rugs are added or removed, where windows are opened and closed, where the number of people in the room changes, etc.

Moreover, since the equalizer is of course adjusted with the microphone in a single location, there is no assurance that the response characteristics at other locations will be similarly equalized. Thus, should the user decide to position himself in a different location he must either readjust the equalizer with the microphone in the new location, or tolerate any non-uniformities in the overall frequency response characteristics, as measured at that location.

SUMMARY OF THE INVENTION

It is an object of the present invention to provide an equalizer for use in a high fidelity audio reproduction system and which does not require the conventionally required set up procedures.

It is another object of the present invention to provide an audio equalizer which continuously adjusts the equalization of the audio signal in accordance with the changing characteristics of the listening environment.

It is still another object of the present invention to provide an audio equalizer which will automatically readjust itself, during normal operation, when the adjustment microphone is relocated in the listening enviromment.

To accomplish these and other objects, the present invention provides an equalizer having closed loop control of the frequency versus amplitude transfer characteristics thereof, with the listening environment, itself, being enclosed within the feedback loop. More specifically, the present invention provides an audio equalizer for use in an audio system for producing audio frequency sounds in arbitrary listening environments, which comprises means for determining the differences between the frequency versus amplitude characteristics of the audio signal being supplied by the signal source and the acoustic signal actually being reproduced in the listening environment. The frequency versus amplitude characteristics of the automatic equalizer are automatically adjusted in accordance with this determined difference so as to thereby provide the equalized audio signal which is to be applied to the speakers.

In the disclosed embodiments, the equalizer includes separate circuits for independently determining the frequency versus amplitude characteristics of the audio signal being generated by the signal source and the frequency versus amplitude characteristics of the acoustics signal being propagated within the listening environment. It is therefore possible to directly compare the two frequency versus amplitude characteristics under the conditions of the actual signal being supplied by the signal source. The equalizer is thus able to substantially continuously update the transfer characteristics of the equalizer in accordance with any changes which may take place in the frequency response characteristics of the listening environment.

BRIEF DESCRIPTION OF THE DRAWINGS

The foregoing and other objects and advantages of the present invention will become more readily apparent from the following detailed description, as taken in conjunction with the accompanying drawings, wherein.

DETAILED DESCRIPTION OF THE DRAWINGS

Figure 1:
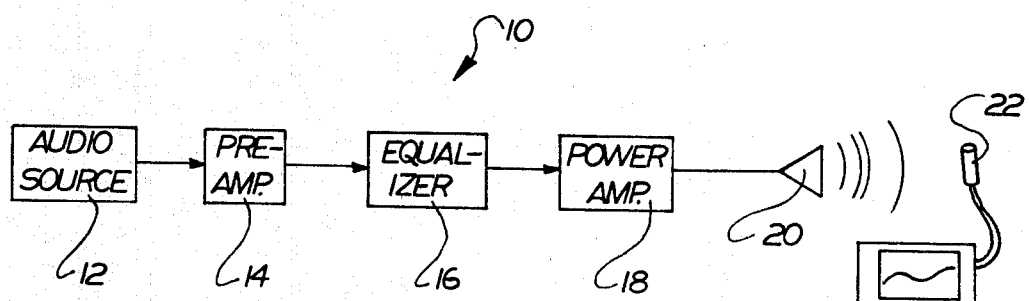
FIG. 1 is a broad block diagram of a prior art audio reproduction system including a conventional equalizer.

FIG. 1 illustrates a conventional high fidelity reproduction system 10 employing an audio equalizer. In this Figure, the system is shown as including an audio signal source 12 for generating the audio signals which are to be reproduced. This audio signal source may, for example, comprise a reel-to-reel, cartridge or cassette tape deck, a turntable, AM/FM tuner, etc. The output of the audio source 12 is provided to a preamplifier 14 whose function is to select one of a plurality of audio sources 12, to provide a preliminary stage of the fixed equalization for such sources as tape decks, turntables, etc., and to provide such operator controls as tone control and volume control. The output of the preamp 14 is provided to an equalizer 16 having an adjustable frequency response characteristic. The output of the equalizer 16 is applied to a power amplifier 18 which amplifies the resulting equalized signal to sufficient power levels to drive a speaker 20. The speaker 20 converts the electrical signal at the output of the power amplifier 18 into an acoustic signal which then propagates through the listening environment.

Conventionally, the equalizer 16 will be adjusted in this sytem by applying pink or white noise to the preamplifier 14 in place of the audio signal which would normally be supplied by the audio source 12. Since the noise has a known frequency versus amplitude distribution, it is particularly easy to detect any nonuniformity in the frequency response characteristics of the system. A special microphone 22 is then installed within the listening environment at a selected location to pick up the acoustic signals being generated by the speaker 20. This microphone 22 is selected to have a flat frequency response over the entire range of the audio signals produced by the audio system 10. The output of the microphone 22 is supplied to a spectrum analyzer 24 which provides a display of the frequency versus amplitude characteristics of the signal being received by the microphone 22. The controls on the equalizer 16 are then adjusted so that the frequency versus amplitude characteristic displayed on the screen of the spectrum analyzer 24 is substantially the same as that of the noise.

In accordance with the present invention, the equalizer 16 is replaced by a self-correcting audio equalizer which incorporates the listening environment within a feedback loop to provide automatic and continuous readjustment of the frequency response characteristics of the equalizer in accordance with the changing characteristics of the listening environment. In this system, the microphone utilized in the listening environment to detect the acoustic signals need not have a flat frequency versus amplitude characteristic, since its characteristic may be cancelled out by factory set adjustments within the equalizer.

Figure 2:
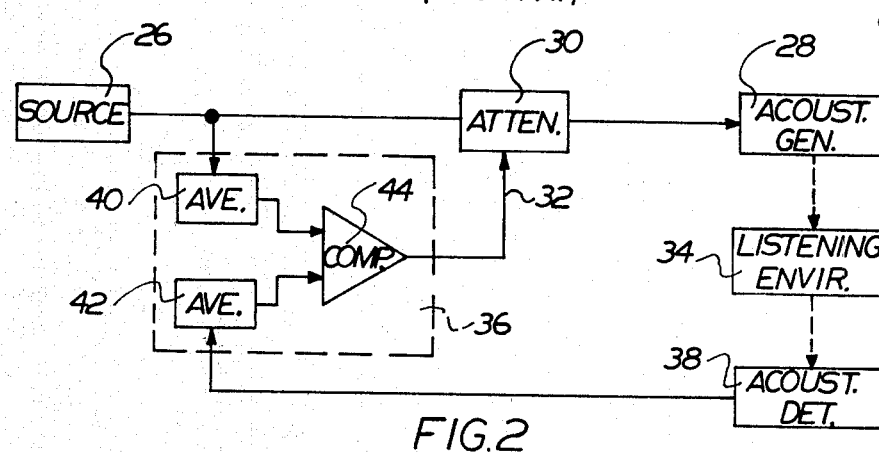
FIG. 2 is a broad block diagram illustrating the principles of operation of the present invention.

FIG. 2 illustrates the broad feedback control principles of operation of the present invention, although not in the specific application of an audio equalizer. In this Figure, signal source 26 provides the audio signal which is to be transformed into an acoustic signal by an acoustic generator 28. The source 26 corresponds with the audio source 12 and preamp 14 of FIG. 1, whereas the acoustic generator 28 corresponds with power amplifier 18 and speaker 20. In FIG. 2, a controlled attenuator 30 is interposed in the signal path between the source 26 and the acoustic generator 28. Thus, the gain of the signal applied to the acoustic generator 28 will vary depending upon a control signal applied along a control line 32 to the attenuator 30. In FIG. 2, the control signal applied to the line 32 is generated by a feedback control loop incorporating the listening environment therein.

The acoustic signal generated by acoustic generator 28 will propagate within a listening environment, shown schematically in FIG. 2 and indicated by reference numeral 34. This listening environment may have any aribitrary attenuation characteristics, which characteristics will generally be unknown. Consequently, the amplitude of the acoustic signal provided within the listening environment 34 will bear an unknown relationship to the signal provided by source 26.

To provide closed loop control of the level of this acoustic signal, a level comparator 36 is provided which compares the level of the signal provided at the output of source 26 with the level of the acoustic signal within the listening environment. The amplitude of the acoustic signal is determined by detecting this acoustic signal with an acoustic detector 38 (e.g., a microphone). The acoustic detector 38 converts the acoustic signal back into an electrical signal and provides it to one of the two inputs into the level comparator 36. The other input to the level comparator 36 is derived from the source 26. The level comparator 36 averages the levels of each of the two input signals in respective averaging circuits 40 and 42 and thereby provides two DC signals having DC values representative of the average values of each of the input signals. A comparator 44 amplifies the difference between the DC levels of these two signals, and provides the amplified difference signal along the control line 32 to the attenuator 30. A closed loop control system is thereby provided.

During normal operation, this feedback loop will maintain a linear relationship between the signal provided by source 26 and the acoustic signal within the listening environment 34. In the event, for example, that the listening environment 34 provides a greater level of attenuation for one type of acoustic signals than for others the DC level provided at the output of averaging circuit 42 will also diminish. This will cause the output of comparator 44 to also diminish, thereby causing the attenuator 30 to reduce the level of attenuation of the signal supplied by source 26. The magnitude of the sound within the listening environment will therefore gradually increase until equilibrium is once again restored in the feedback loop. The time constant of the feedback loop will preferably be made rather long (for example, 1-60 seconds) to desensitize the equalizer adjustment loop to ambient noises in the listening environment.

Figure 3:
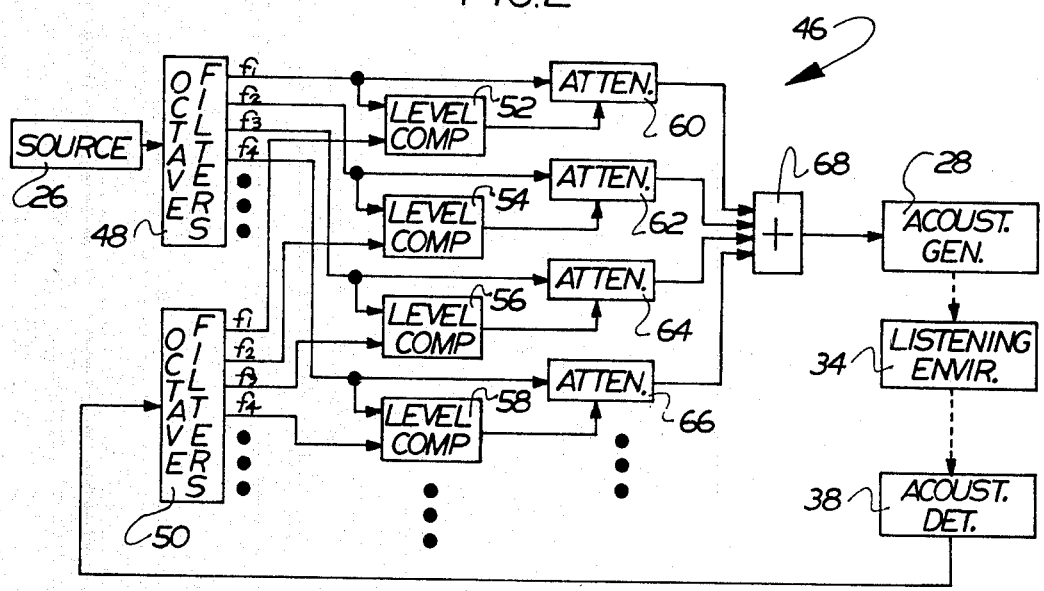
FIG. 3 is a more detailed block diagram illustrating a practical embodiment of the present invention.

FIG. 3 broadly illustrates one form which an audio equalizer incorporating the general concept of FIG. 2 might take. For convenience of description, elements of FIG. 3 which correspond with similar elements of FIG. 2 have been numbered with similar reference numerals. Generally, the audio equalizer system 46 shown in FIG. 3 separates the signal supplied by the source 26 into a plurality of frequency components, and provides a feedback loop such as shown in FIG. 2 for each of these frequency components. More specifically, the audio equalizer 46 includes two octave filters 48 and 50 which respectively separate the source signal and the feedback signal into similar frequency components. The octave filters 48 and 50 are substantially similar, each comprising a like number of bandpass filters having a common input and separate outputs, with each output representing one of the outputs of the octave filter 48 and 50. The various bandpass filters will be tuned to contiguous bands across the entire audio frequency spectrum. Although illustrated in FIG. 3 as providing only four outputs, generally a much larger number of bandpass filters (e.g., 10) will be provided. The cutoff frequencies for these bandpass filters may be as follows:

TABLE 1

| Frequency Component | Passband |
| --- | --- |
| $F_1$ | 20–40 Hz |
| $F_2$ | 40–80 Hz |
| $F_3$ | 80–160 Hz |
| $F_4$ | 160–320 Hz |
| $F_5$ | 320–640 Hz |
| $F_6$ | 640–1280 Hz |
| $F_7$ | 1280–2560 Hz |
| $F_8$ | 2560–5120 Hz |
| $F_9$ | 5120–10,240 Hz |
| $F_{10}$ | 10,240–20,480 Hz |

Since the design and operation of bandpass filters of this nature is well known in the art, they will not be either illustrated or described in any detail hereinafter.

The audio equalizer 46 provides individual level comparators 52–58 and attenuators 60–66 for each of the frequency components. Each of the level comparators 52–58 will have the form similar to that of level comparator 36 of FIG. 2, and will respond at one input to a given frequency component of the source signal, and at the other input to the corresponding frequency component of the feedback signal supplied by the acoustic detector 38. Consequently, the attenuators 60–66 for each of the frequency components will be automatically adjusted until the feedback signal supplied by the acoustic detector 38 has the same frequency distribution as that of the source signal supplied by source 26.

This presumes, of course, that the various level comparators 52–58 are substantially identical to one another. Any desired relationship between the frequency distributions of the source and feedback signals may be secured by utilizing level comparators which are not identical.

In this fashion, the audio equalizer automatically adjusts itself in accordance with the frequency versus amplitude characteristics of the specific listening environment within which the system is used. Furthermore, this automatic adaptation process takes place continuously during the use of the system, hence any changes which may take place within the room during use of the system are automatically taken into account, and do not effect the operation of the system. Also, the acoustical detector 38 may be moved about from place to place in the listening environment, and the equalizer will automatically readapt itself to the new location.

In a stereo system, the feedback signal derived by the acoustical detector 38 will represent a composite of both the left and right stereo signals, and will not generally correspond to either the left or the right signal independently. Preferably, the detector 38 will be located somewhere midway between the left and right acoustical generators, hence the feedback signal will essentially correspond to the sum of the two signals. Consequently the circuit of FIG. 3 must be modified slightly. Since there will in this event be two signal sources (both left and right stereo signal sources) there must similarly be two source octave filters, rather than the single octave filter 48 illustrated in FIG. 3. The two octave filters will each have the same form described previously with respect to octave filters 48 and 50, and hence each will provide corresponding frequency components of the respective input signal supplied thereto. Each octave filter will have a corresponding one of the two stereo signals provided at the input thereof. The corresponding frequency components appearing at the outputs of the two source octave filters will be combined in corresponding summing circuits, with each of the sum signals thus provided being supplied to the source signal input of the corresponding one of level comparators 52–58.

The outputs of each of the level comparators 52–58 will then each be provided to two attenuators, one for each of the two corresponding source frequency channels. Since the two attenuators for each frequency channel are controlled by common control signals, the frequency response characteristic of the audio equalizer is the same for the left and right channels. Finally, two summing circuits 68 must also be provided, each combining the various equalized frequency components for one of the two stereo signals. Thus, the equalized stereo signals will be reconstructed, and will be provided to a corresponding pair of acoustic generators 28.

Figure 4:
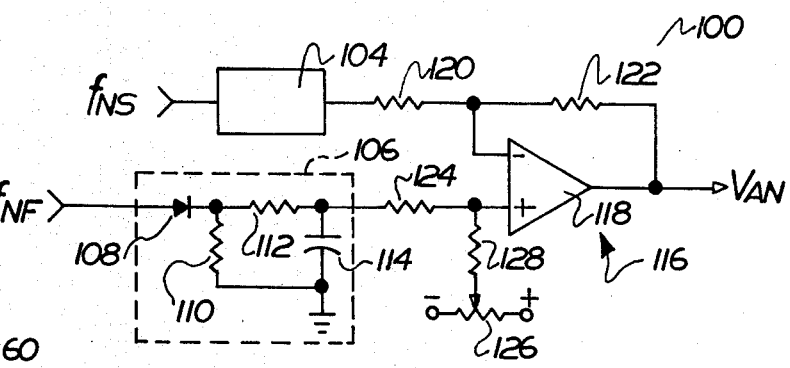
FIG. 4 is a schematic illustration of a level detector circuit for use in the system of FIG. 3.

FIG. 4 illustrates more specifically one form which each of the level comparators 52–58 may take. In this Figure, level comparator 100 is illustrated as including two averaging circuits 104 and 106. Although only averaging circuit 106 is shown in detail in FIG. 4, it will be understood that averaging circuit 104 may have substantially the same form. The averaging circuit 106 is shown in FIG. 4 as including a peak rectifying circuit comprised of a diode 108 and bleed resistor 110, and an RC filter comprised of a resistor 112 and capacitor 114. In operation, the incoming AC signal will be half-wave rectified by diode 108, with the amplitude of the resulting rectified signal being averaged by the RC filter. The bleed resistor 110 permits the voltage across capacitor 114 to decay with time at a controlled rate. The voltage developed across capacitor 114 in this circuit will essentially correspond with the average magnitude of the AC signal supplied at the input to the circuit 106.

The input to the averaging circuit 104 will be connected to one of the outputs from one of the octave filters 48, whereas the input to averaging circuit 106 will be connected to the corresponding one of the outputs of the other octave filter 50. The DC signals provided at the output of averaging circuits 104 and 106 will then be compared in a comparator 116 comprised of an operational amplifier 118 connected in a conventional difference amplifier arrangement. The operational amplifier 118 is illustrated in FIG. 4 as having its inverting input connected to the output of averaging circuit 104 through an input resistor 120. The inverting input to the operational amplifier is also connected to its own output through a feedback resistor 122. The gain of the operational amplifier 118 will be established by the ratio of resistors 120 and 122. The noninverting input to operational amplifier 118 is illustrated in FIG. 4 as being connected to the output of averaging circuit 106 through a resistor 124 which will preferably have a value approximately equal to that of the parallel combination of resistors 120 and 122.

Also supplied to the noninverting input of the operational amplifier 118 is a D.C. signal provided by a potentiometer 126, connected between positive and negative voltage supplies. The wiper arm of potentiometer 126 is connected to the noninverting input through a resistor 128. The purpose of the potentiometer 126 and resistor 128 is to provide a manually variable bias voltage to the comparator 116. This is necessary to adjust out any nonlinearities in the frequency response of the microphone utilized as the acoustic detector 38. In operation, these potentiometers will preferably be factory adjusted to correspond with the frequency response of the particular microphones supplied with the circuit, and will thereafter require no readjustment. The procedure for making these factory adjustments may be similar to the procedure outlined previously with respect to the set-up of prior art equalizers.

The voltage appearing at the noninverting input to amplifier 118 will essentially represent a sum of the signals provided by the bias circuit 126 and the averaging circuit 106. The operational amplifier 118 will therefore provide a signal at its output corresponding to the amplified difference between this signal and the signal supplied by the averaging circuit 104. As stated previously, the output of amplifier 118 is utilized to drive an attenuator circuit interposed in the corresponding frequency channel $f_n$.

Figure 5:
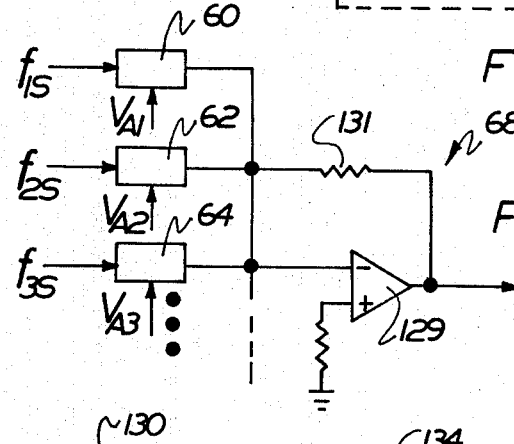
FIG. 5 is a schematic illustration of a summing circuit which could be used in the system of FIG. 3.

As illustrated in FIG. 5, the summing circuit 68 comprises a conventional operational amplifier 129 wherein each of the voltage controlled attenuators is directly connected to the inverting input thereof. In this embodiment, the control voltages $V_A$ control the resistance level between the input and output of the associated attenuators, thereby controlling the contribution of the various associated input signals $f_{ns}$ to the total signal provided at the output at the operational amplifier.

Figure 6:
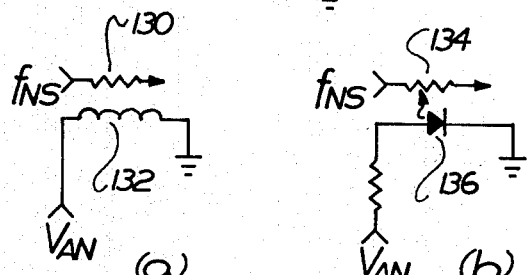
FIGS. 6(a)–6(c) are schematic illustrations of controlled attenuator circuits for use in the system of FIG. 3.

FIGS. 6(a)–6(c) illustrates three possible forms which the voltage controlled attenuators 60–66 of FIG. 3 could take. In FIG. 6(a), a thermistor 130 is used as a voltage variable attenuator, with an associated heating element 132 controlling the temperature of and thus the resistance of the thermister 130. The heat supplied by the heating element 132 will vary in accordance with the voltage supplied at an input $V_{AN}$ thereto, thereby controlling the resistance of the thermistor element 130. The thermistor responds rather slowly to changes in the control signal. Because of this slow response time, the thermistor has the effect of averaging the control signal $V_{AN}$ over a somewhat lengthy time interval. The time constant of the attenuator will, for example, be on the order of one-half minute or one minute. This largely desensitizes the equalizer adjustment loop to many ambient noises, such as slamming doors, thunder, etc.

The attenuator illustrated in FIG. 6(b) operates in a somewhat similar manner, and also includes a controlled resistive element 134. In this embodiment, the resistor 134 is photosensitive, having a resistive level which changes with the level of light impinging thereon. To control the resistive level of resistor 134, then, a light emitting diode 136 is provided which is coupled to the input signal $V_{AN}$ through a resistor 138. Variation in the magnitude of the input signal $V_{AN}$ effects the level of current flowing through the light emitting diode 136, thereby controlling the intensity of light emitted thereby and hence the resistive level of the photosensitive resistor 134. Since the light emitting diode has an extremely fast response time, the overall time constant of the equalizer adjustment loop will not be significantly influenced by it. Damping of the response time of the equalizer must therefore be provided elsewhere in the loop to secure the desired long time constant. One fashion in which this could be done is by connecting an appropriately sized capacitor across the resistor 122 in each of the level comparators.

The controlled attenuator illustrated in FIG. 6(c) employs a somewhat different approach than that of the attenuators of FIGS. 6(a) and 6(b). This attenuator changes the level of attenuation of the input signal $f_{ns}$ in a stepwise manner, rather than a continuous one as with the previous embodiments. In this embodiment, a plurality of resistors 148, 150, 152 and 154 are coupled between the input signal $f_{ns}$ and the input to the summing circuit 68. A like plurality of switches 156, 158, 160 and 162 are also provided, each connected in series with a corresponding one of the resistors. The switches 156–162 may take the form of simple mechanical reed switches, or may instead comprise solid state switching elements.

The total attenuation of the signal $F_{ns}$ provided by the controlled attenuator of FIG. 6(c) will depend upon which of the switches 156–162 is closed at any given time. Since there are 16 different combinations of switch positions, there will be 16 different levels of attenuation which may be provided by the circuit. The one of the sixteen attenuation levels provided thereby will be selected by the switches under the control of corresponding voltage signals provided along control lines 164. Since the switches controlled by the control lines 164 may each have one of two positions, the control signals will also be of a bilevel nature, rather than of a continuous analog nature as with the signals controlling the attenuators of FIGS. 6(a) and 6(b).

If the resistors 156, 158, 160 and 162 have values which follow a binary progression (e.g., resistor 156 having a value R, and resistors 158, 160 and 162 having values 2R, 4R and 8R, respectively), then the contribution of $f_{ns}$ to the signal at the output of amplifier 129 will be proportional to the binary value of the word provided along lines 164.

Of course, the level comparator circuitry illustrated and described with respect to FIG. 4 provides a single analog control voltage $V_{an}$ rather four bilevel signals as required by the controlled attenuator of FIG. 5C. The two circuits may, however, nonetheless be interfaced with one another through a conventional four bit analog-to-digital converter. This approach is not preferred, however, both in view of the added cost of analog-to-digital converters, and of the fact that one analog-to-digital converter would have to be provided for each of the attenuator circuits. The need for a plurality of analog-to-digital converters could, however, be eliminated by multiplexing a single analog-to-digital converter among the various attenuators, and using buffer circuits between the analog-to-digital converter and each of the attenuators to hold the corresponding binary control words provided thereto by the analog-to-digital converter.

Figure 7:
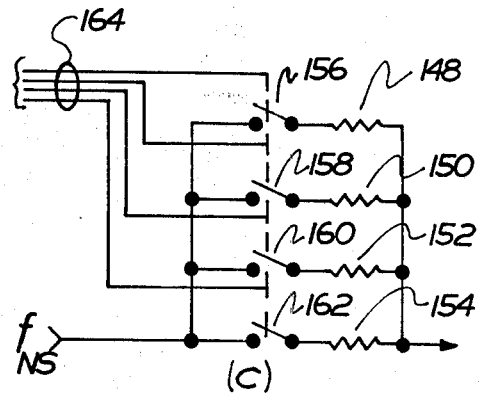
FIG. 7 is a broad block diagram of a system employing a microprocessor to control incremental attenuators such as those illustrated in FIG. 6(c); and, FIG. 8a–8d is a flow chart illustrating the sequence of operations performed by the microprocessor of FIG. 7.
Figure 7:
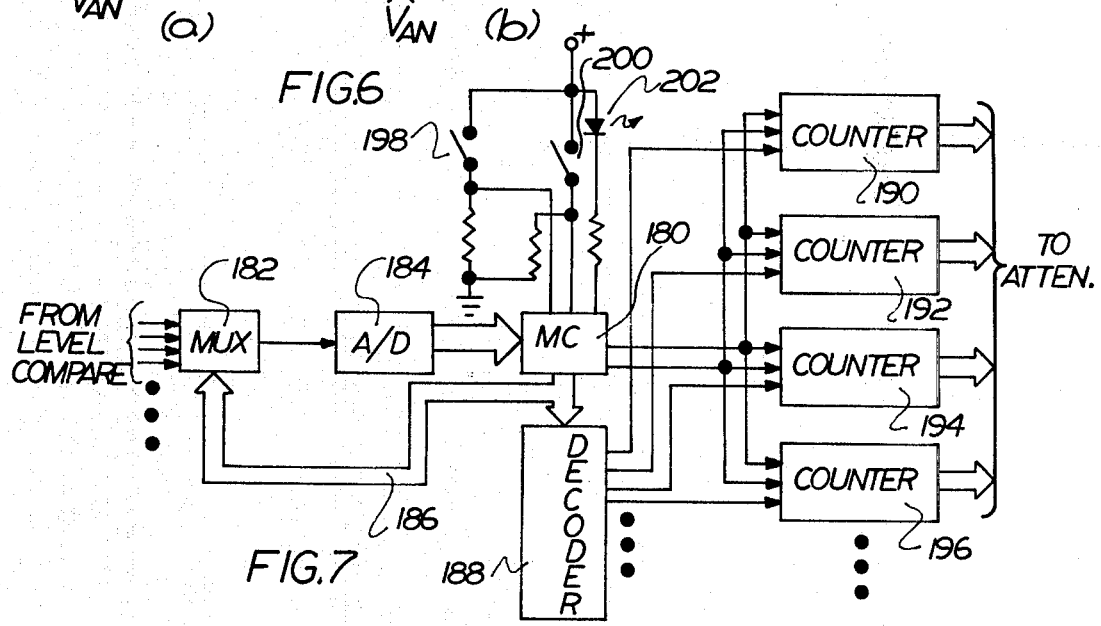
Figure 8:
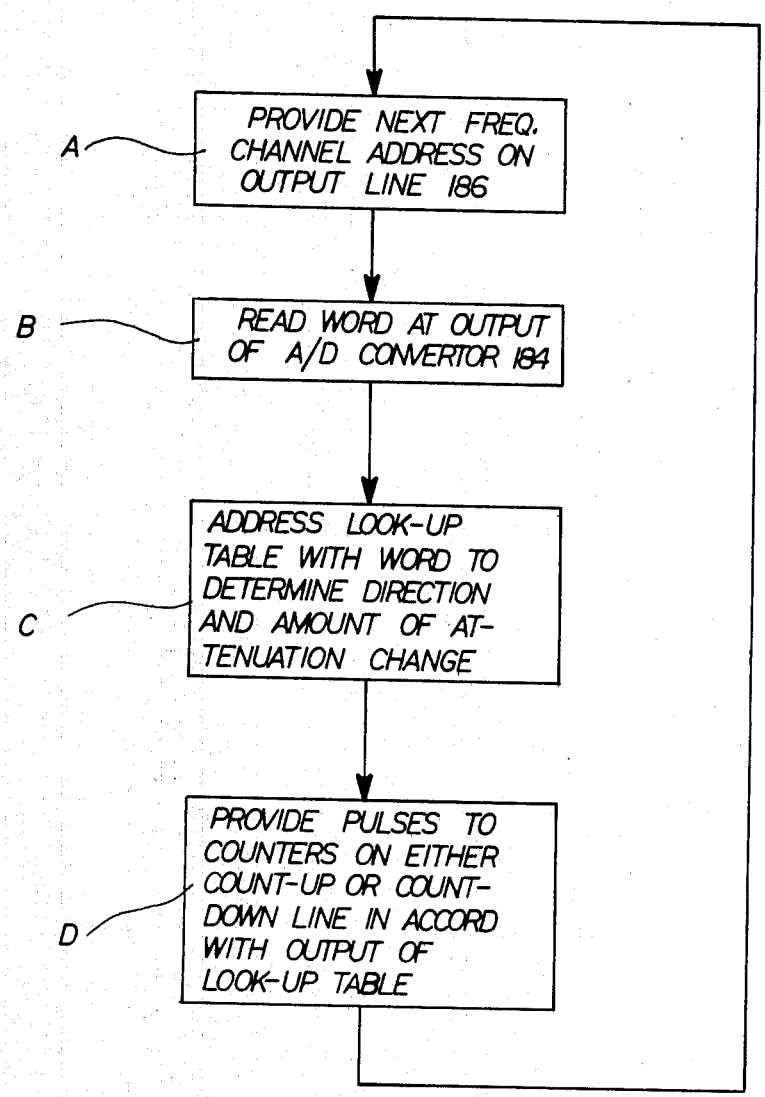

FIG. 7 illustrates a portion of an embodiment employing a microprocessor for controlling the controlled attenuators in accordance with the signals provided by the various level comparators. FIG. 8 is a flow chart illustrating the sequence of operations performed by the microprocessor of FIG. 7. The microprocessor, its various memory and peripheral circuits together form a microcomputer system MC, indicated in the single block 180 of FIG. 7. The outputs of the various level comparators are interfaced with a microcomputer 180 through an analog multiplexor circuit 182 and an analog-to-digital converter 184. The microcomputer 180 provides a digital word from an output port to a bus 186 (step A) for controlling the multiplexer 182 and a decoder 188 whose purpose will be described in greater detail hereinafter. This digital word provided along bus 186 causes multiplexor 182 to connect a corresponding one of the outputs of the level comparators to the input to the analog-to-digital converter 184. The analog-to-digital converter 184 then digitizes this analog signal, thereby placing it in a form in which it may be used by the microcomputer 180. The microcomputer 180 then reads in that value (step B), and readjusts the level of attenuation in the corresponding frequency channel (steps C and D, see below) in accordance therewith.

To control the various attenuators (each having a form similar, for example, to that illustrated in FIG. 6(c)) a plurality of counters 190, 192, 194 and 196 are provided, each associated with a corresponding one of the controlled attenuators. Only one of these counters 190–196 will be enabled at any given time, in accordance with enablement signals provided by the decoder 188. The decoder 188 responds to the digital word provided along the bus 186 to enable the one of the counters 190–196 which corresponds to the level comparator whose output is then connected to the analog-to-digital converter 184. These counters 190–196 are bi-directional, and are controlled by clock pulses provided to COUNT UP and COUNT DOWN inputs thereto. All of the COUNT UP inputs of the various counters are commonly connected to one output of microcomputer 180, whereas all of the COUNT DOWN inputs to the counters are commonly connected to a second output of the microcomputer 180. As stated previously, however, only a single one of the counters 190–196 will be enabled to respond to these clock pulses at any given time, under the control of the outputs provided by the decoder 188.

Upon reading a digital word corresponding to the output signal of one of the level comparators (step B), the microcomputer 180 will determine (either by appropriate computations or by reference to a look-up table stored in memory) whether or not the associated counter must be incremented, or decremented, and by how much (step C). When some adjustment is necessary, the microcomputer 180 will apply an appropriate number of pulses along either the COUNT UP or COUNT DOWN output line (step D), thereby adjusting the count contained within the counter enabled at that time, and thus the level of attenuation provided by the attenuator associated therewith. The disabled counters will not respond to these clock pulses. In each adjustment cycle, the microcomputer will sequentially update the adjustment of each of the frequency channels, thereby providing substantially continuous adjustment of the frequency response characteristics of the audio equalizer.

Although, in FIG. 7, the microcomputer system is illustrated as responding to the outputs of level comparators, the system could as easily, and perhaps more cost-effectively, be constructed to instead provide the outputs of the various averaging circuits to the A/D convertor 184 through a multiplexor 182 having twice as many inputs. This approach would eliminate the need for the comparators 44. The microcomputer 180 would, in this case, adjust the feedback signal in accordance with the frequency response characteristics of the microphone then being used (stored in a memory in the microcomputer), determine the difference between the thus adjusted signal and the source signal, determine the appropriate amount by which the associated attenuator must be adjusted, apply the proper clock pulses to the associated counter to accomplish this adjustment, and then proceed on to the adjustment of the next frequency channel.

The proper loop time constant may be established in a microcomputer-controlled system by constraining the maximum rate at which the microcomputer can increment the counters. For example, the microcomputer may be programmed to increment the counters at a rate no greater than one step per adjustment cycle, and to have a time delay between successive adjustment cycles of perhaps ten seconds or more. Alternatively, the adjustment program could include a procedure for digitally filtering the differences between the source and feedback signals for each frequency channel, with this digital filtering procedure having an effective time constant equal to the desired loop time constant.

In FIG. 7, adjustment of the equalizer loop is made more user controllable by providing an "auto-adjust" on-off switch 198 and "fast-adjust" momentary push buttom 200 on the equalizer control panel, both scanned periodically by the microcomputer 180. The microcomputer is programmed to cyclically update the equalizer adjustments only when switch 198 is open. Closing of switch 198, sensed by the appearance of +V at that input to the microcomputer, causes the microcomputer to suspend updating operations until the switch is once again opened. Thus, when switch 198 is closed, the equalizer settings are frozen at their present values. The microcomputer is further programmed to decrease substantially the loop time constant when switch 200 is depressed. This permits the operator to select a faster equalizer adjustment rate when listening environment characteristics or microphone location have been substantially changed. In addition, an indicator light (consisting, in FIG. 7, of LED 202) is provided to indicate to the operator whether or not the equalizer is out of adjustment. The microcomputer 180 will cause this LED 202 to be illuminated as long as the adjustment required in any frequency channel is greater than a specified limit, stored in the microcomputer memory. These refinements may, of course, also be added to the non-microcomputer controlled embodiments.

Although the invention has been described with respect to preferred embodiments, it will be appreciated that various rearrangements and alterations of parts may be made without departing from the spirit and scope of the present invention, as defined in the appended claims.

What is claimed is:

1. An audio equalizer for use in a system including an audio signal source for providing a first audio signal, and sound reproducing means responsive to a second audio signal for reproducing sounds in accordance therewith, said audio equalizer being responsive to said first audio signal for providing said second audio signal to said sound reproducing means, comprising:
 means responsive to said reproduced sounds and to said first audio signal for determining the difference between the frequency versus amplitude characteristics thereof, and
 means for automatically adjusting the frequency versus amplitude characteristics of said first audio signal in accordance with said determined difference, with the resulting adjusted audio signal being provided to said sound reproducing means as said second audio signal.

2. An audio equalizer as set forth in claim 1, wherein said difference determining means comprises means for determining the time averaged said difference.

3. An audio equalizer as set forth in claim 1, wherein said difference determining means comprises means for determining the time averaged said difference and having a time constant on the order of 0.5 minutes.

4. An audio equalizer as set forth in claim 1, and further comprising means controllable by an operator for disabling said automatic adjustment means to thereby maintain the frequency versus amplitude characteristics of said first audio signal as they were just prior to said disablement.

5. An audio equalizer as set forth in claim 1, wherein said difference determining means comprises means responsive to said reproduced sounds to provide a third audio signal in accordance therewith, and means for determining the difference between said frequency versus amplitude characteristics of said reproduced sounds and said first audio signal by determining the difference between the frequency versus amplitude characteristics of said first and third audio signals.

6. An audio equalizer as set forth in claim 5, wherein said means for determining the difference between the frequency versus amplitude characteristics of said first and second audio signals comprises means for separating each of said first and second audio signals into a plurality of frequency components, means for comparing the level of each of said frequency components of said first audio signal with the level of the like frequency component of said second audio signal, means for automatically adjusting the amplitudes of each of said frequency components of said first audio signal in accordance with the results of the corresponding said comparison, and means for combining the resulting amplitude adjusted frequency components to thereby derive said second audio signal.

7. An audio equalizer as set forth in claim 6, wherein said means for providing said third audio signal has a frequency response characteristic which is not flat, whereby the frequency versus amplitude characteristic of said third audio signal is not identical to the frequency versus amplitude characteristic of said reproduced sounds, and wherein said means for comparing includes means for adjusting said comparisons in accordance with said frequency response characteristic.

8. An audio equalizer as set forth in claim 6, wherein said means for comparing comprises a plurality of level detector means, each associated with a corresponding one of said frequency components of said first and third audio signals, for each providing a signal whose DC level varies with the level of the corresponding frequency component, a plurality of difference amplifier means each responsive to the two DC signals provided by two level detector means which respond to corresponding frequency components of said first and third audio signals to provide a difference signal which varies with the difference between said two DC signals, and wherein said means for automatically adjusting comprises means for adjusting the amplitude of each said frequency components of said first audio signal in accordance with the corresponding said difference signal.

9. An audio equalizer as set forth in claim 8, wherein said means for adjusting the amplitudes of each said frequency components comprises a plurality of heat sensitive means, each associated with a corresponding one of said frequency components, and each providing an amplitude adjustment of the corresponding component in dependence upon the temperature of that heat sensitive means, and means for controlling the temperatures of each of said heat sensitive means in accordance with the corresponding said difference signal.

10. An audio equalizer for use in an audio system producing audio frequency sounds in a listening environment, comprising:
 first input means adapted to be responsive to a first audio signal to be equalized,
 output means for providing an equalized audio signal to be used in producing said audio frequency sounds,
 second input means responsive to a second audio signal derived from sounds produced in said listening environment by said audio system, and
 means for, during normal use of said audio system, automatically determining the differences between the frequency versus amplitude characteristics of said first and second audio signals and adjusting the frequency versus amplitude characteristic of said first audio signal in accordance with said determined difference so as to thereby provide said equalized audio signal.

11. An audio equalizer as set forth in claim 10, wherein said automatic determining and adjusting means comprises microcomputer means programmed to adjust said frequency versus amplitude characteristics of said first audio signal in accordance with said determined difference.

12. An audio equalizer as set forth in claim 11, wherein said microcomputer means comprises means programmed to adjust said characteristics in accordance with the time averaged said difference.

13. A method of automatically equalizing an audio signal during normal operation of a high fidelity sound reproduction system comprising the steps of:
 providing a first audio signal,
 generating an acoustic signal from an equalized said first audio signal,
 deriving a second audio signal from said acoustic signal,
 determining, during normal operation, the amplitude versus frequency characteristics of both said first and second audio signals, and automatically modifying the frequency versus amplitude characteristic of said first audio signal in accordance with the difference between said determined amplitude versus frequency characteristics of said first and second audio signals to thus provide said equalized first audio signal for use in generating said acoustic signal.

14. A self-correcting audio equalizer for use in a system wherein an audio signal source provides a first audio signal which is to be reproduced as an acoustic signal by sound reproducing means, comprising:
means for regenerating a second audio signal from the acoustic signal provided by said sound reproducing means,
means for separating each of said first and second audio signals into a plurality of frequency components,
means for comparing the level of each of said frequency components of said first audio signal with the level of the like frequency component of said second audio signal,
means for automatically adjusting the amplitudes of each of said frequency components of said first audio signal in accordance with the results of the corresponding said comparison, and
means for combining said amplitude adjusted frequency components to thereby derive an equalized said first audio signal for driving said sound reproducing means.

15. A self-correcting audio equalizer as set forth in claim 14, wherein said means for comparing comprises a plurality of level comparator means, each corresponding to a respective one of said frequency components of said first audio signal and responsive to said corresponding frequency component and the like frequency component of said second audio signal for providing an output signal whose level varies in accordance with the difference between the level of said components.

16. A self-correcting audio equalizer as set forth in claim 15, wherein said automatic adjusting means comprises a plurality of controlled attenuator means, each responsive to a corresponding frequency component of said first audio signal for adjusting the amplitude thereof in accordance with the output signal of the corresponding said level comparator means.

17. A self-correcting audio equalizer as set forth in claim 14, wherein said regenerating means has a frequency response characteristic which is not flat whereby the frequency versus amplitude characteristics of said second audio signal and acoustic signals are different, and wherein said comparing means includes means for compensating said comparison for said non-flat frequency response characteristic.

* * * * *

Notice of Adverse Decision in Interference

In Interference No. 101,135, involving Patent No. 4,340,780, L. Odlen, SELF-CORRECTING AUDIO EQUALIZER, final judgment adverse to the patentee was rendered Oct. 29, 1985, as to claims 1, 2, 5, 6, 10 and 13.
[*Official Gazette April 1, 1986.*]